United States Patent
Neild et al.

(10) Patent No.: US 6,664,622 B2
(45) Date of Patent: Dec. 16, 2003

(54) HEADER FOR ELECTRONIC COMPONENTS BOARD IN SURFACE MOUNT AND THROUGH-HOLE ASSEMBLE

(75) Inventors: Kristopher K. Neild, Aurora, IL (US); Claude Fernandez, Palatine, IL (US); Charles Schaefer, Crystal Lake, IL (US)

(73) Assignee: Texas Instruments Incorporated, Dallas, TX (US)

( * ) Notice: Subject to any disclaimer, the term of this patent is extended or adjusted under 35 U.S.C. 154(b) by 6 days.

(21) Appl. No.: 09/780,766

(22) Filed: Feb. 9, 2001

(65) Prior Publication Data

US 2001/0033019 A1 Oct. 25, 2001

Related U.S. Application Data

(60) Provisional application No. 60/181,701, filed on Feb. 10, 2000.

(51) Int. Cl.⁷ ................................. H01L 23/48
(52) U.S. Cl. ............ 257/697; 257/698; 257/699; 361/719; 361/760; 361/761; 361/743; 361/756
(58) Field of Search ................ 257/697, 698, 257/699; 361/719, 760, 761, 743, 756

(56) References Cited

U.S. PATENT DOCUMENTS

| H13 H | 1/1986 | Vratny | 439/71 |
|---|---|---|---|
| 5,221,209 A | 6/1993 | D'Amico | 439/66 |

Primary Examiner—David L. Talbott
Assistant Examiner—Luan Thai
(74) Attorney, Agent, or Firm—W. Daniel Swayze, Jr.; W. James Brady; Frederick J. Telecky, Jr.

(57) ABSTRACT

A low-cost header for connecting an electronic components board to a circuit board is disclosed, consisting of side walls made of an unwarpable plastic material and joined together to form a frame around an area substantially the same as the area of the components board. A plurality of metal pins are located in the frame, each having one end extending from said frame such that these ends can be soldered to the components board concurrently with the solder attachment of the components to the board. The other ends of the pins can be formed so that they are adjusted for either through-hole attachment to circuit boards, or for surface mounting.

7 Claims, 2 Drawing Sheets

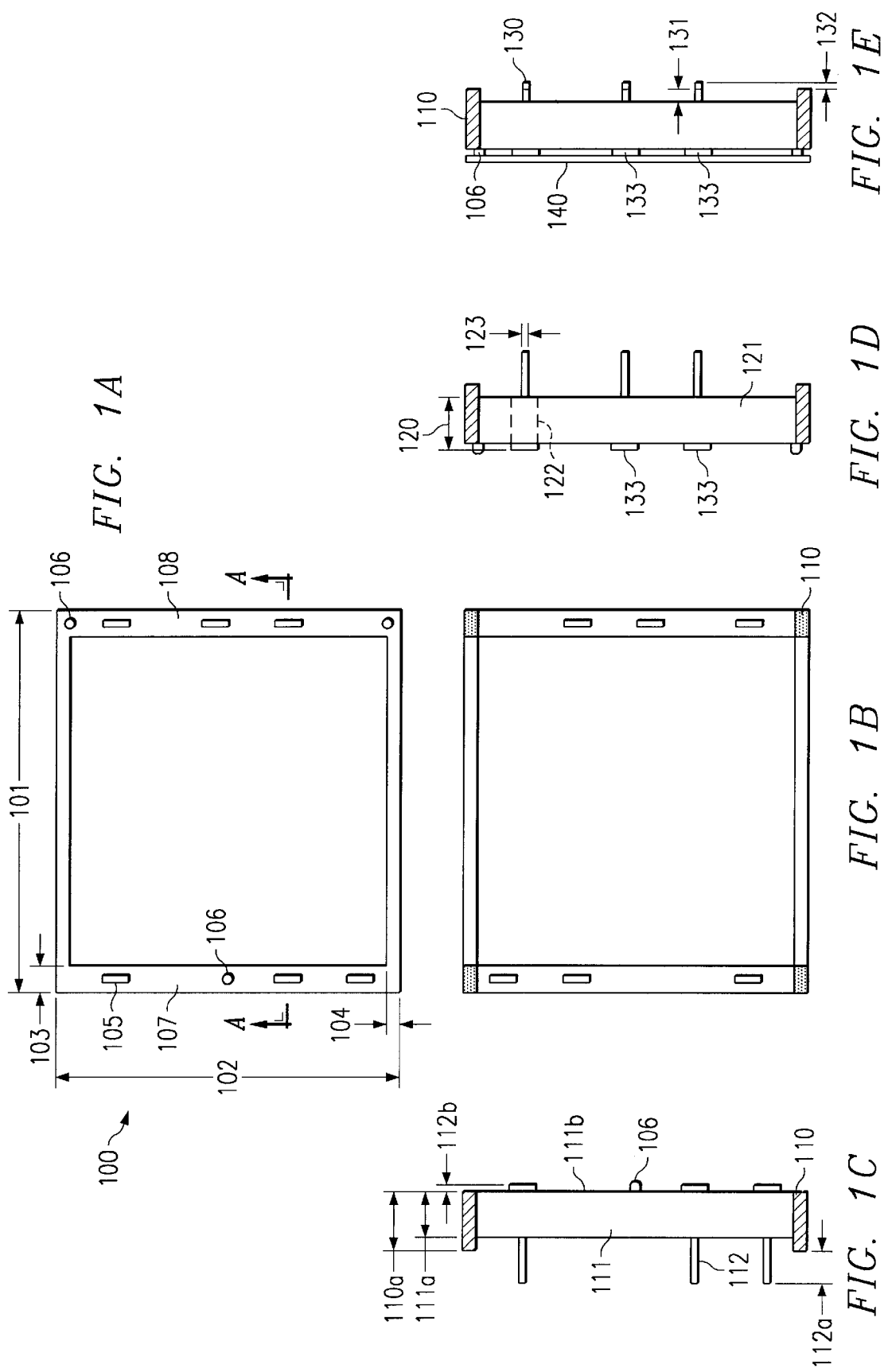

HEADER FOR ELECTRONIC COMPONENTS BOARD IN SURFACE MOUNT AND THROUGH-HOLE ASSEMBLE

This application claims the benefit of provisional application No. 60/181,701 filed Feb. 10, 2000.

FIELD OF THE INVENTION

The present invention is related in general to the field of semiconductor devices and assembly and more specifically to the design and fabrication of a plastic header adaptable to through-hole as well as surface mount board assembly.

DESCRIPTION OF THE RELATED ART

For many electronic applications, it is advantageous from electrical and cost standpoints to first group a plurality of electronic components together and to assemble this group on an intermediate substrate ("components board"). In a second step, this subassembly unit is then assembled on the actual circuit board or motherboard. Examples can be found in applications as diverse as power supplies, telephone stations, central offices, desktop computers, automotive equipment, and many more.

In conventional technology, the substrates preferred for assembling the components group are metallic leadframes. These leadframes have to be custom-made for each size and input/output configuration of the subassembly units. Unfortunately, these leadframes are expensive, since their manufacture requires costly stamping tools for stamping the leadframes from the original metal sheets. (The alternative method of etching the leadframes is usually even more expensive).

In addition, one has to decide beforehand, whether the leadframes should be designed and employed for through-hole assembly onto circuit boards, or for surface mounting. An individual leadframe cannot be converted from one to the other assembly method. This fact puts severe constraints onto the design and assembly process of circuit boards.

Furthermore, in today's technology, the process of assembling the components onto the leadframes has to be performed one unit at a time, since it does not lend itself to batch processing; the process is, therefore, not cost-effective and also requires intensive process and quality controls.

In summary, an urgent need has arisen for a coherent concept of a components substrate which is low-cost in its structure and fabrication, reliable in its performance, and flexible in its method of usage. The substrate design, method of fabrication and method of usage should be flexible enough to be applied for different semiconductor product families and a wide spectrum of design and assembly variations, and should achieve improvements towards the goal of enhanced process yield and device reliability. Preferably, these innovations should be accomplished while shortening production cycle time and increasing throughput, and using the installed equipment base in the user's house so that no investment in new assembly pick-and-place machines is needed.

SUMMARY OF THE INVENTION

According to the present invention, a low-cost header for connecting an electronic components board to a circuit board is disclosed, consisting of side walls made of an unwarpable plastic material and joined together to form a frame around an area substantially the same as the area of the components board. A plurality of metal pins are located in the frame, each having one end extending from said frame such that these ends can be soldered to the components board concurrently with the solder attachment of the components to the board. The other ends of the pins can be formed so that they are adjusted for either through-hole attachment to circuit boards, or for surface mounting.

It is an aspect of the present invention to be applicable to semiconductor devices used for a variety of different applications, for instance DC to DC converters, power supplies, telephone central stations, telecommunication equipment, transmitting towers, central office computers. In all applications, the invention achieves technical advantages as well as significant cost reduction and production throughput increase.

It is another aspect of the present invention to maintain for the plastic header the same footprint, which the conventional metallic leadframe uses. Consequently, there is no change required for the circuit board of the end-user.

It is another aspect of the present invention to design and employ a tab for the plastic header such that the attachment of the header to the components board is facilitated and can be performed by conventional pick-and-place machines. Further, the tab can be designed so that is provides orientation control for the automatic machinery, and can be removed and discarded after handling by the machines.

It is another aspect of the invention to eliminate separate solder reflow steps for attaching the semiconductor components to the components board and for attaching the header to the components board. The two solder attachment operations can now be performed concurrently, thus lowering the manufacturing cost and enhancing product reliability.

It is another aspect of the invention to provide header material and designs, and assembly processes, for batch processing. As an example, instead of only one unit at a time, header panels of more than a dozen units can be processed.

It is another aspect of the invention to select plastic materials for the header which are insensitive to deformation in the temperature range of the solder process. Consequently, the headers do not warp in the process temperature range. Further, they are tolerant to process-induced stresses in the practical thickness ranges.

These aspects have been achieved by the teachings of the invention concerning materials, structure and methods suitable for mass production. In one embodiment of the invention, nylon-based materials such as flame retardant, heat stabilized and glass-fiber strengthened Stanyl® are employed, varying the header wall thickness as parameter.

In another embodiment of the invention, geometrical header dimensions and pin locations are provided to serve as examples for assembling the components for a DC to DC converter, as manufactured by Power Trends, Warrenville, Ill., U.S.A.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIGS. 1A to 1E are simplified views of the first and second embodiments of the header for an electronic components board according to the invention.

FIG. 1A is a top view of the header frame.

FIG. 1B is a bottom view of the header frame.

FIG. 1C is a side view of the header frame, with pins designed for through-hole attachment, located in the respective side wall openings.

FIG. 1D is a side view of the header frame, with pins designed for through-hole attachment, located in the respective side wall openings.

FIG. 1E is a side view of the header frame as in FIG. 1D, however with pins designed for surface mounting, located in the respective side wall openings; furthermore, a components board is attached to the header.

FIG. 2A is a cross section of the header having pins designed for through-hole attachment.

FIG. 2B is a cross section of the header having pins designed for surface mounting; furthermore, a components board is attached to the header.

FIG. 3A is a bottom view of the header frame having a tab attached.

FIG. 3B is a side view of the header frame having a tab attached.

DETAILED DESCRIPTION OF THE PREFERRED EMBODIMENTS

Figure 2A:
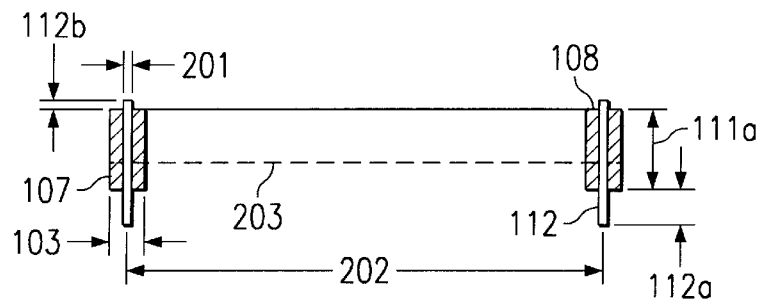
FIGS. 2A and 2B are simplified cross sectional views of the first and second embodiments of the header for electronic boards.

FIGS. 1A to 1E and FIGS. 2A and 2B illustrate an example of the first and second embodiments of the invention, namely a header for an electronic components board which can be adopted for through-hole attachment to circuit boards and for surface mounting. The function of the header is to provide a simple, solid and reliable mechanical and electrical connection of a board filled with assembled electronic components to a printed circuit board, or motherboard.

FIG. 1A is a top view of the header example. It consists of a rectangular planar frame generally designated 100. The four side walls of the frame have lengths so that the area enclosed by the frame is substantially the same as the area of the components board to be attached to the frame. In the example shown in FIG. 1A, the frame length 101 is about 40.6 mm and the frame width 102 about 35.8 mm. The side walls, which have to offer space for openings to accommodate the metallic pins, have a thickness 103 of about 2.9 mm, the side walls without additional structure have a thickness 104 of about 1.0 mm. The latter thickness has to be chosen carefully so that the part is designed with enough strength to sustain thermomechanical stresses during assembly processing without any deformation.

As FIG. 1A shows, selected side walls have a plurality of openings 105, extending from one surface of the side wall to the opposite surface (see FIG. 1D) and left empty in the molding fabrication process. These openings serve to accommodate metallic pins, which are needed for mechanical and electrical connection of the frame to the circuit board. Number and location of these openings depend on the number of pin connections required and their respective location on the circuit board. Size and shape of these openings are determined by the size and shape of the pin heads located in these openings (see FIG. 4).

FIG. 1A further shows a plurality of geometric features 106, which are suitable for aligning the frame 100 to the components board. As the side view of the frame in FIG. 1C illustrates, these geometric features 106 may be small hillocks or bumps, which fit into corresponding dimples of the components board. The inverse solution is also useful: The alignment features may consist of dimples in frame 100, corresponding to bumps formed on the components board.

It is essential for the present invention that frame 100 is made of an electrically insulating material. These materials simplify the assembly steps and can be obtained at lower cost than conventional metallic leadframes. Particularly useful are plastic materials which do not warp in the temperature range of the assembly processes. A preferred material choice for the present invention is a group of nylon-based flame retardant and heat stabilized materials commercially available under the trade name Stanyl®. The materials are manufactured by DSM Engineering Plastics, Evansville, Ind. 47720, U.S.A. Nylon 46 materials with suitable mechanical and thermal properties have the catalogue numbers Stanyl® TE351, TE250F3, TE250F6, and TE250F9. By way of example, the mechanical property data are reproduced in APPENDIX FIG. 1, some processing parameters (such as molding temperature) are tabulated in APPENDIX FIG. 2.

The preferred method of header fabrication is molding when the headers are to be manufactured in mass production numbers. Other methods, however, are also acceptable, especially when only small numbers are to be manufactured, or more complicated header designs are to be realized. One such method is to glue the frame from simple parts, using a high-temperature and stress-insensitive adhesive.

FIG. 1B is a bottom view of header frame 100. The corners 110 are shown shaded in order to indicate the position of the plurality of plastic frame parts serving as posts, which space the header from the circuit board. These posts are molded together with frame 100. More detail of these posts is shown in the side views of FIGS. 1C, 1D, and 1E.

FIG. 1C is a side view of the header, when looked at from the outside of header width 107. The side wall 111 has a height 111a, which, in the example shown in FIG. 1C, is approximately 4.7 mm. More important is the height 110a of post 110. It has to insure sufficient spacing of the header from the circuit board, and sufficient length 112a of pins 112 for reliable pin penetration into the circuit board through-holes. In the example of FIG. 1C, length 112a is about 3.1 to 3.2 mm.

Figure 4:
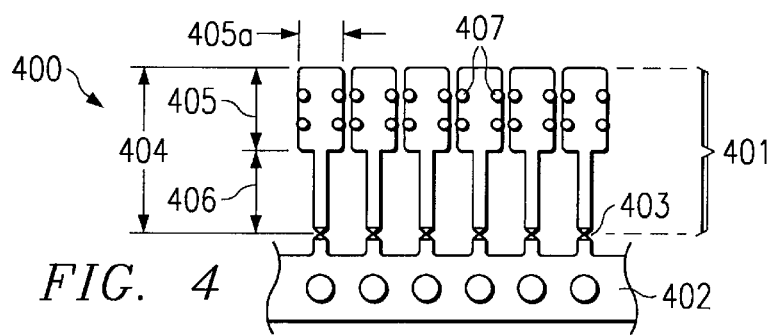
FIG. 4 is a simplified top view of a plurality of pins, used by the header of the invention, before they are singulated.

Pins 112 are made of metal, preferably a copper alloy (more detail see FIG. 4). In addition to the function of electrically connecting the terminals of the components board to the circuits board, the pins must have a surface at both ends, which facilitates soldering to the components board and to the circuit board, respectively. The preferred surface preparation includes a plated layer of nickel followed by a thin plated layer of palladium. Detail about nickel and palladium layers, and also solder plating as practiced for semiconductor leadframes, can be found, for instance, in European Patent # 0 335 608 B1 (Abbott, 1995, "Leadframe with Reduced Corrosion") and U.S. Patent Application # 60/138,070 (Abbott, 1999, "Palladium-Spot Leadframes for Solder Plated Semiconductor Devices and Method of Fabrication").

Another option includes preplating the whole pin surface with solderable metal, preferably free of lead. Economical and practical metal options include tin, indium, alloys of tin/indium, tin/silver, and tin/bismuth.

For the soldering step to the components board, it is crucially important that one end of pins 112 is fitted into header openings 105 such that this end extends a predetermined length 112b from the surface 111b of side wall 111. It is further important that this extended length 112b is equal for all pins of the plurality of pins 112. When solder paste is applied to each extended pin end, all pins are then able to make contact concurrently to the respective terminals of the components board. In the example shown in FIGS. 1C to 1E, the extended length 112b is about 0.4 mm. Together with its height 111a, the side wall 111 and extended pins requires a length 120 of about 5.1 mm, as indicated in FIG. 1D.

FIG. 1D is a side view of the header, when looked at from the outside of header width 108. The dashed lines 122 inside the side wall 121 indicate the outlines of the openings 105, which extend from one surface 121a to the opposite surface 121b of side wall 121. The size of the openings 105 are thus such that they can safely hold the first ends of pins 112 ("pin heads", see FIG. 4) by pressure fitting. The second ends of pins 112 have preferably a width 123 of about 0.7 to 0.8 mm.

FIG. 1E is also a side view of the header, when looked at from the outside of header width 108 with two modifications compared to FIG. 1D: First, the second ends 130 of pins 112 are modified for surface mounting; second, components board 140 (without components) is attached to the header.

Surface mounting requires forming or bending the second pin ends into a shape which allows solder attachment onto the surface of circuit boards. The step of bending is performed in so-called trim-and-form machines similar to the ones which are widely used in the assembly-and-test factories for semiconductor components. After the bending, a straight pin length 131 of about 1.3 mm is still protruding from the side wall. In addition, the bending has a geometry sufficient to insure that the formed pin extends a length 132 of about 0.4 mm over the length 110a of the spacing posts 110 and is thus correctly positioned for surface mounting.

In FIG. 1E, components board 140 is aligned by geometrical features 106 to the header. As shown in FIG. 1C, the geometrical features may consist of plastic bumps formed on the header, which fit into corresponding dimples of board 140. The alignment of board 140 and header 100 insures that pin heads 133 (see also FIG. 1D) contact the electrical terminals at the bottom of board 140 (not shown in FIG. 1E) for soldering and electrical continuity. Boards 140 are sheet-like plastic materials selected from a group consisting of FR-4, FR-5, BT resin, glass-fiber strengthened dielectrics, or other epoxies or polyimides. The preferred thickness is in the range 1.0 to 1.2 mm. Integral with the boards is plurality of electrically conductive routing lines, terminals located on the top surface for soldering the electronic components (not shown in FIG. 1E), and the above-mentioned terminals located on the bottom surface for soldering to the pins of the header.

Figure 2B:
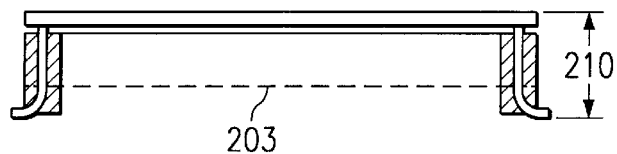

FIGS. 2A and 2B are cross sections of the header along line A—A in FIG. 1A. Pins 112 are inserted in side walls 107 and 108, which have a thickness 103 of about 2.9 mm. As described above, the pins protrude a length 112b. Typical pin thickness 201 is about 0.6 to 0.8 mm. In the example of FIG. 2A, the center line distance 202 of the pins located in opposing side walls is about 38.1 mm.

In the cross section of the header in FIG. 2B, the components board is attached as in FIG. 1E, and the pins are formed for surface mounting to the circuit board. In the embodiment shown, the total height 210 of the assembly is about 8.0 mm. As in FIG. 2A, the dashed line 203 indicates the height of the side walls.

Figure 3A:
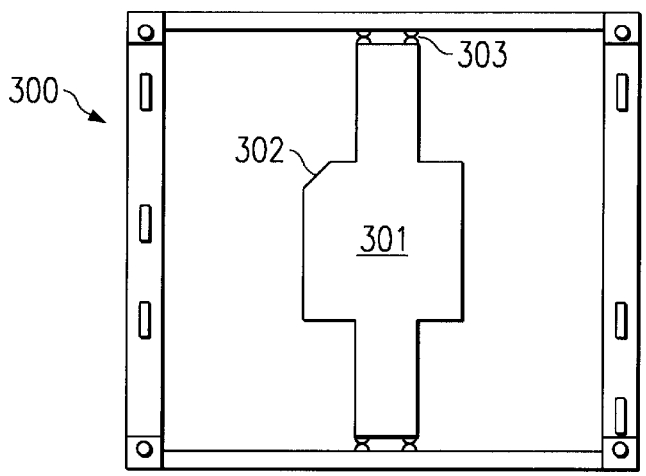
FIGS. 3A and 3B are simplified views of the third embodiment of the header for an electronics components board according to the invention.

FIG. 3A is a bottom view of the header, generally designated 300, with a tab 301 attached for handling header 300 in assembly pick-and-place machines. Tab 301 is made of plastic, preferably the same material as header 300 and molded in the same fabrication process. Tab 301 has a design feature 302, which allows the recognition system of the pick-and-place machine to control the header orientation for correct positioning of the header relative to the components board in the assembly process to the components board. After completing the header-to-board assembly, tab 301 can be broken off the header 300 at attachment points 303.

Figure 3B:
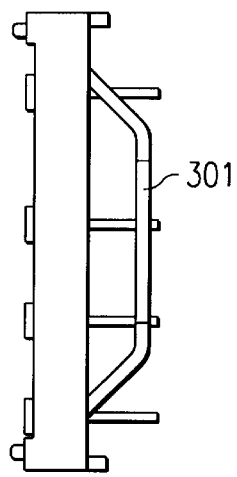

FIG. 3B shows the tab 301 in side view. It is easy to see how practical the curvature of the tab is for the gripping mechanisms of the pick-and-place-machine. After the header is attached to the components board, tab 301 can be broken off the frame and discarded.

It may be mentioned that FIGS. 3A and 3B illustrate slight variations of the header design compared to the one shown in FIGS. 1A to 1E. These variations demonstrate the flexibility of the concept of the invention.

As an example for a practical, inexpensive way to mass-produce the pins to be incorporated in the header of the invention, FIG. 4 shows a portion of a metal sheet, generally designated 400, with some pins 401 stamped from the sheet. Pins 401 are still attached to the rail 402, which will be discarded after the pins are broken off at the narrow constrictions 403. In the example of FIG. 4, the length 404 of the pins 401 is approximately 10 mm. Each pin has a first end 405 and a second end 406. The first end 405 is about 5.0 mm long and 2.5 mm wide (designated 405a in FIG. 4), the second end 406 about 5.0 mm long and 0.8 mm wide. Each first (wide) end of the pins has a plurality of dimples, shown as small circles 407. Number and position of the dimples may vary for each header design. The dimples serve to insure a stable pressure fit of the pins in the openings of the plastic header walls.

Pins 401 are preferably stamped from a copper sheet about 0.6 mm thick. Since the first pin ends need to be soldered to the components board, and the second pin ends to the circuit board, there are two options of making the pins suitable for soldering: Just in local areas, or the complete pin surface. The metallurgical choices have been discussed above. For many applications, conventional pre-plating with 100% tin of the whole pin surface is satisfactory. Care has to be taken, however, that the header attachment to the components board (including the components attachment to the components board) is performed at a higher reflow temperature than the soldering of the completed unit to the circuits board. It is, of course, desirable to prevent a re-melting of the assembled components-head-and-board unit during the assembly of the unit to the circuits board.

In the assembly steps of soldering the header to the components board and the unit to the circuits board, it is often helpful to employ conventional soldering paste. In this case, the soldering as well as the subsequent rinse steps follow established manufacturing practices. The assembly of the header to the components board and the concurrent assembly of the electronic components to the components board, includes the process steps as follows:

Aligning the terminals on the bottom board surface with the pin ends extending from the header frame, and the board dimples with the header bumps (see FIG. 1E);

contacting the bottom board surface with the solder paste deposited on the extending pin ends, concurrently inserting the plastic bumps into the dimples (see FIG. 1E);

placing solder paste on the terminals on the top board surface;

providing selected electronic components;
aligning the components with matching terminals on the top board surface;
contacting the components with the solder paste of the matching terminals;
increasing the temperature to reflow the solder paste between the pin ends and the bottom terminals, and concurrently between the components and the top terminals;
cooling the temperature for solidifying the solder.

After completing the assembly, the unit is electrically tested and then most often shipped to the customer, who will perform the assembly to the circuits board.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the header may be made of a material different from the nylon-based material described. As another example, the electronic components may include active and passive components, and semiconductor devices made from silicon, silicon germanium, gallium arsenide, or any other semiconductor material used in manufacturing.

As another example, the combined heights consumed for device assembly, components board, plastic frame and pins can be minimized in order to reduce the thickness consumed by the assembled unit. The invention can thus be applied to the manufacture of "thin" assemblies. It is therefore intended that the appended claims encompass any such modifications or embodiments.

We claim:

1. A header for connecting an electronic components board to a circuit board, comprising:
   a plurality of side walls joined together to form a planar frame around an area substantially the same as the area of said components board, said frame having first and second surfaces;
   said side walls made of plastic material unwarpable at assembly temperatures, and having a thickness suitable for tolerating process-induced stresses;
   a plurality of geometric features in said first surface, suitable for aligning said frame to said components board;
   selected side walls having a plurality of openings extending from said first to said second surface;
   a plurality of metal pins intended for assembly to said circuit board, each of said pins having a first end and a second end;
   said first end of each of said pins located in one of said openings, respectively, such that it extends a predetermined length from said first surface, said length equal for each of said pins; and
   said second end of each of said pins protruding from said second surface;
   wherein each of said first ends of said pins protrudes a length of about 0.3 to 0.4 mm.

2. A header for connecting an electronic components board to a circuit board, comprising:
   a plurality of side walls joined together to form a planar frame around an area substantially the same as the area of said components board, said frame having first and second surfaces;
   said side walls made of plastic material unwarpable at assembly temperatures, and having a thickness suitable for tolerating process-induced stresses;
   a plurality of geometric features in said first surface, suitable for aligning said frame to said components board;
   selected side walls having a plurality of openings extending from said first to said second surface;
   a plurality of metal pins intended for assembly to said circuit board, each of said pins having a first end and a second end;
   said first end of each of said pins located in one of said openings, respectively, such that it extends a predetermined length from said first surface, said length equal for each of said pins; and
   said second end of each of said pins protruding from said second surface;
   wherein said first ends of said pins have surfaces wettable by solder.

3. A header for connecting an electronic components board to a circuit board, comprising:
   a plurality of side walls joined together to form a planar frame around an area substantially the same as the area of said components board, said frame having first and second surfaces;
   said side walls made of plastic material unwarpable at assembly temperatures, and having a thickness suitable for tolerating process-induced stresses;
   a plurality of geometric features in said first surface, suitable for aligning said frame to said components board;
   selected side walls having a plurality of openings extending from said first to said second surface;
   a plurality of metal pins intended for assembly to said circuit board, each of said pins having a first end and a second end;
   said first end of each of said pins located in one of said openings, respectively, such that it extends a predetermined length from said first surface, said length equal for each of said pins; and
   said second end of each of said pins protruding from said second surface;
   wherein said plastic material of said frame is DMS Stanyl TE25OF6.

4. The header according to claim 3, wherein a molding process is used to fabricate said frame.

5. A header for connecting an electronic components board to a circuit board, comprising:
   a plurality of side walls joined together to form a planar frame around an area substantially the same as the area of said components board, said frame having first and second surfaces;
   said side walls made of plastic material unwarpable at assembly temperatures, and having a thickness suitable for tolerating process-induced stresses;
   a plurality of geometric features in said first surface, suitable for aligning said frame to said components board;
   selected side walls having a plurality of openings extending from said first to said second surface;
   a plurality of metal pins intended for assembly to said circuit board, each of said pins having a first end and a second end;
   said first end of each of said pins located in one of said openings, respectively, such that it extends a predetermined length from said first surface, said length equal for each of said pins; and said second end of each of said pins protruding from said second surface;

wherein said side wall thickness is in the range from about 0.9 to 1.2 mm for side walls without pin openings, and from about 2.7 to 3.0 mm for side walls with pin openings.

6. A header for connecting an electronic components board to a circuit board, comprising:

a plurality of side walls joined together to form a planar frame around an area substantially the same as the area of said components board, said frame having first and second surfaces;

said side walls made of plastic material unwarpable at assembly temperatures and having a thickness suitable for tolerating process-induced stresses;

a plurality of geometric features in said first surface, suitable for aligning said frame to said components board;

selected side walls having a plurality of openings extending from said first to said second surface;

a plurality of metal pins intended for assembly to said circuit board, each of said pins having a first end and a second end;

said first end of each of said pins located in one of said openings, respectively, such that it extends a predetermined length from said first surface, said length equal for each of said pins;

said second end of each of said pins protruding from said second surface; and further having a tab attached to said side walls, said tab suitable for handling said frame by pick-and-place machines and removable after said handling.

7. The header according to claim 6 wherein said tab has an outline for identifying orientation of said header in pick-and-place machines.

* * * * *